United States Patent
Frey et al.

(10) Patent No.: US 12,261,618 B2
(45) Date of Patent: Mar. 25, 2025

(54) CIRCUIT AND METHOD FOR PROCESSING AN ANALOG SIGNAL

(71) Applicant: Sony Group Corporation, Tokyo (JP)

(72) Inventors: Matthias Frey, Stuttgart (DE); Diederik Paul Moeys, Stuttgart (DE)

(73) Assignee: SONY GROUP CORPORATION, Tokyo (JP)

(*) Notice: Subject to any disclaimer, the term of this patent is extended or adjusted under 35 U.S.C. 154(b) by 195 days.

(21) Appl. No.: 17/890,272

(22) Filed: Aug. 18, 2022

(65) Prior Publication Data
US 2023/0073161 A1 Mar. 9, 2023

(30) Foreign Application Priority Data
Aug. 27, 2021 (EP) .................................. 21193600

(51) Int. Cl.
*H03M 1/12* (2006.01)

(52) U.S. Cl.
CPC ......... *H03M 1/1255* (2013.01); *H03M 1/121* (2013.01)

(58) Field of Classification Search
CPC ...... H03M 1/255; H03M 1/121; H03M 1/126; H03M 1/124; H03M 1/12
USPC ................................................... 341/122, 155
See application file for complete search history.

(56) References Cited

U.S. PATENT DOCUMENTS

| | | | | |
|---|---|---|---|---|
| 7,439,897 | B1 * | 10/2008 | Gorin | H03M 1/0629 341/123 |
| 2011/0215903 | A1 * | 9/2011 | Yang | H04W 52/0254 340/8.1 |
| 2012/0170767 | A1 | 7/2012 | Astrom et al. | |
| 2014/0288876 | A1 * | 9/2014 | Donaldson | A61B 5/681 702/141 |
| 2015/0002324 | A1 * | 1/2015 | Sharma | H03M 1/124 341/122 |
| 2020/0295738 | A1 | 9/2020 | Reedman | |

FOREIGN PATENT DOCUMENTS

CN 109077740 A 12/2018

* cited by examiner

*Primary Examiner* — Peguy Jean Pierre
(74) *Attorney, Agent, or Firm* — XSENSUS LLP (57) ABSTRACT

The present disclosure pertains to a circuitry for processing an analog signal, wherein the circuitry is configured to generate a sample control signal depending on an energy level of the analog signal in at least one predefined frequency band, and control a sampling rate for sampling the analog signal based on the generated sample control signal.

18 Claims, 4 Drawing Sheets

CIRCUIT AND METHOD FOR PROCESSING AN ANALOG SIGNAL

CROSS-REFERENCE TO RELATED APPLICATION

The present application claims priority to European Patent Application No. 21193600.0, filed Aug. 27, 2021, the entire contents of which are incorporated herein by reference.

TECHNICAL FIELD

The present disclosure generally pertains to a circuit and a method for processing an analog signal.

TECHNICAL BACKGROUND

Generally, for processing an analog signal with a computer, the analog signal is converted into a digital signal.

Analog-to-digital conversion is typically performed by measuring, with a sampling rate, values of the analog signal at distinct time points and quantizing them.

For example, an analog audio signal corresponds to the quantized time course of a sound wave. For analog-to-digital conversion of the analog audio signal, distinct values of the analog audio signal are acquired, e.g. at a sampling rate of 44.1 kHz, and quantized, and the time series of the quantized distinct values is used as digital signal.

Although there generally exist techniques for sampling an analog signal, it is desirable to improve circuits and methods for sampling an analog signal.

SUMMARY

According to a first aspect, the disclosure provides a circuitry for processing an analog signal, the circuitry being configured to: generate a sample control signal depending on an energy level of the analog signal in at least one predefined frequency band, and control a sampling rate for sampling the analog signal based on the generated sample control signal.

According to a second aspect, the disclosure provides a method for processing an analog signal, the method including: generating a sample control signal depending on an energy level of the analog signal in at least one predefined frequency band, and controlling a sampling rate for sampling the analog signal based on the generated sample control signal.

Further aspects are set forth in the dependent claims, the following description and the drawings.

BRIEF DESCRIPTION OF THE DRAWINGS

Embodiments of the present disclosure are explained by way of example with respect to the accompanying drawings, in which.

DETAILED DESCRIPTION OF EMBODIMENTS

Figure 1:
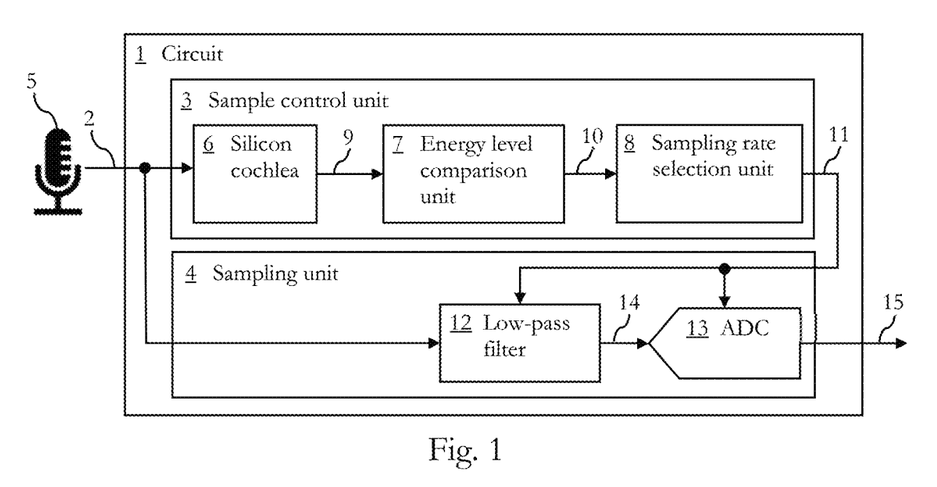
FIG. 1 illustrates, in a block diagram, an embodiment of a circuit for processing an analog signal using a silicon cochlea.

FIG. 1 illustrates an embodiment of the present disclosure. Before a detailed description of the preferred embodiments is given, general explanations are made.

As mentioned above, analog-to-digital conversion of an analog signal is typically performed by measuring, with a sampling rate, values of the analog signal at distinct time points and quantizing them.

For example, an analog audio signal corresponds to the time course of a sound wave. For analog-to-digital conversion of the analog audio signal, it is known that distinct values of the analog audio signal are acquired, e.g. at a sampling rate of 44.1 kHz (without limiting the present disclosure in that regard), and the time series of the distinct values is used as digital signal. In some embodiments, the acquired distinct values of the analog signal are quantized, and the time series of the quantized distinct values is used as digital signal, i.e. the digital signal that includes the quantized distinct values corresponds to the (time course of the) analog signal.

According to the Nyquist-Shannon sampling theorem, the range of frequencies that can be represented unambiguously in a digital signal may be limited by the sampling rate.

For a given sampling rate, the highest frequency that can be represented in a digital signal obtained by sampling an analog signal is (typically) half the given sampling rate and is also known as Nyquist frequency.

Conversely, for a given frequency that should be represented in a digital signal, the minimum required sampling rate is twice the given frequency and is also called the Nyquist rate.

For example, theoretically, a digital signal with a sampling rate of 44.1 kHz, which corresponds to 44100 values per second of the corresponding analog signal, cannot unambiguously represent frequencies higher than 22.05 kHz, which is half the sampling rate.

On the other hand, typically, the higher the sampling rate is, the more values the digital signal contains per time unit, which requires more power for sampling the digital signal, a higher data rate for transmitting the digital signal and/or more memory for storing the digital signal. Especially, if the sampling rate is higher than necessary, power could be wasted in sampling.

These two mutually opposed criteria may lead to a compromise when choosing a sampling rate for sampling an analog signal:

If a low sampling rate is chosen, it has been recognized that, in some instances, the obtained digital signal may have a poor quality because, if no cut-off low-pass filter is present, aliasing occurs due to undersampling or because, if a cut-off low-pass filter is present, frequency components higher than the Nyquist frequency are cut off, thus reducing the fidelity of the sampled signal. However, if a high sampling rate is chosen, in some instances, the sampling rate may be higher than the Nyquist rate corresponding to the analog signal, so that power may be wasted for unnecessarily detailed sampling, and unnecessarily high data rate and/or unnecessarily large memory may be consumed by the digital signal.

Normally, a sampling rate for sampling an analog signal is chosen to be (slightly higher than) twice the highest frequency expected to be observed in the analog signal. If a sampling rate is chosen higher than twice the highest frequency likely to be observed in the analog signal, power may be wasted in sampling because a lower sampling rate could be used without information loss.

In some embodiments, when an analog signal is band limited within a frequency band that satisfies certain conditions (i.e. the bandwidth of the analog signal is small enough compared to the center frequency of the analog signal), a sampling rate for sampling the analog signal can be chosen below the Nyquist rate corresponding to the analog signal but above twice the bandwidth of the analog signal. In such a case, subsampling may occur, which creates, by non-destructive aliasing, a replica of the band limited analog signal in the baseband (i.e. below the sampling rate). For example, in some embodiments, a band limited signal with energy only between 10 kHz and 20 kHz need not be sampled with the corresponding Nyquist rate of 40 kHz, but may be sampled only with double the bandwidth frequency 2×(20−10) kHz=20 kHz. In such a case, by sampling the analog signal with 20 kHz, aliasing occurs in a non-destructive way without overlaps and reproduces the analog signal in the baseband.

Hence, in some embodiments, a sampling rate for sampling an analog signal is chosen below the corresponding Nyquist rate but (at least) twice a bandwidth of the analog signal to subsample the analog signal.

However, if frequencies present in the analog signal change over time, the sampling rate may be higher than necessary at some times. It has been recognized that in a case when there are higher frequencies than initially expected present in the analog signal, such higher frequencies may be cut-off or cause aliasing during sampling.

Therefore, it may be desirable in some embodiments to have a smart system for signal processing that adapts a sampling rate for sampling an analog signal based on a highest frequency observed in the analog signal. For example, in some instances, it may be desirable to choose a sampling rate based on the frequency spectrum of an analog signal to be sampled, so that the frequencies contained in the analog signal can be properly represented in the digital signal, and no more power, data rate and/or memory is consumed than necessary for sampling the analog signal. For example, when sampling an analog audio signal with a sampling rate that is adapted based on a highest frequency observed in the analog signal, power or computing resources may be saved in some embodiments without sacrificing audio quality of the sampled audio signal.

Accordingly, in some embodiments, the present disclosure provides to control a sampling rate for sampling an analog signal based on an energy level of the analog signal in at least one frequency band. The energy level of the analog signal in one or more predefined frequency bands may be obtained with low power consumption.

For example, an output similar to a spectrogram may be produced from which a highest frequency component present in the analog signal (i.e. a highest frequency band in which the energy level of the analog signal exceeds an energy threshold) can be obtained in real-time in some embodiments, e.g. almost instantaneously. Based on this highest frequency component present in the analog signal, an optimal sampling rate for sampling the analog signal may be selected. In a case of an analog audio signal, a sampling rate for sampling the analog audio signal in an audio recording system may be dynamically adjusted based on the selected optimal sampling rate.

In some embodiments, by selecting the optimal sampling rate based on the highest frequency component present in the analog signal, power can be conserved while assuring that no meaningful information (i.e. information contained in a frequency band in which the energy level of the analog signal exceeds the energy threshold) is lost due to under-sampling or cut-off of high frequencies, and at the same time redundant information is avoided by sampling with a sampling rate not higher than the minimum necessary.

Thus, some embodiments pertain to a circuitry for processing an analog signal is configured to generate a sample control signal depending on an energy level of the analog signal in at least one predefined frequency band, and control a sampling rate for sampling the analog signal based on the generated sample control signal.

The circuitry may include any entity capable of processing an analog signal, generating the sample control signal and/or controlling the sampling rate. For example, the circuit may include a central processing unit (CPU), a graphics processing unit (GPU), a field-programmable gate array (FPGA), an application-specific integrated circuit (ASIC) and/or a dedicated artificial intelligence (AI) accelerator.

The circuitry may be included in any apparatus that is configured to perform analog-to-digital conversion of an analog signal and, which is also, in some embodiments, configured to generate a digital signal that corresponds to a time course of the analog signal. For example, the circuitry may be included in an audio sensor, a photo sensor, a shock sensor, a seismograph, a sea wave sensor, an electrocardiograph (ECG), an electroencephalograph (EEG) or an oscilloscope.

The analog signal may carry audio information. For example, the analog signal may be an analog audio signal that corresponds to a time course of a sound wave and that is acquired using a microphone. In some embodiments, the analog audio signal is acquired from an analog sound recording medium using, for example, a phonograph or a cassette player.

However, the present disclosure is not limited to an analog signal that carries audio information.

Generally, the analog signal may be any electrical signal whose voltage changes in time corresponding to a physical quantity. For example, the physical quantity may be an air pressure (including sound), a brightness, an acceleration (including a shock), a position (including a height of a land surface or a water wave), a biological electrical activity, a voltage, a current or an electromagnetic field.

The sample control signal may be any signal suitable for controlling a sampling rate. In some instance, it indicates a sampling rate to be used for sampling an analog signal.

The sample control signal may indicate a sampling rate, for example a Nyquist rate, which is a minimum sampling rate to be used, or a sampling rate higher than a Nyquist rate, for example by a predefined offset. In some embodiments, the sample control signal may indicate a lowest sampling rate that is higher or equal to a Nyquist rate out of a predefined plurality of sampling rates. In some embodiments, the sample control signal may indicate a frequency, for example a highest frequency in an analog signal that should be present in the corresponding digital signal, or an upper frequency of a frequency band that should be present in the digital signal.

The sample control signal may be an analog signal oscillating at a sampling rate or a frequency.

The sample control signal may be a pulsed signal with a pulse rate corresponding to a sampling rate or a frequency.

The sample control signal may have a voltage level corresponding to a predefined sampling rate or frequency. For example, the sample control signal may indicate a first sampling rate or frequency by a first (e.g. low) voltage level and a second sampling rate or frequency by a second (e.g. high) voltage level.

The sample control signal may be transmitted via a plurality of lanes, wherein a lane with a predefined (e.g. high) voltage level of the plurality of lanes indicates a sampling rate or a frequency.

The sample control signal may be a digital signal that indicates a value indicating a sampling rate, for example a predefined identifier or a numerical frequency value of the sampling rate to be used sampling rate.

The sample control signal may be generated so that a predefined frequency band in which an energy level of the analog signal exceeds an energy threshold is present in the corresponding digital signal.

For example, a sampling rate may be chosen to be at least twice the upper frequency of the frequency band, i.e. at least the Nyquist rate corresponding to the frequency band. In some embodiments, a plurality of frequency bands may be predefined, and the sampling rate may be chosen to be at least the Nyquist rate corresponding to the highest frequency band of the plurality of predefined frequency bands in which the energy level of the analog signal exceeds an energy threshold.

The energy level of the signal may be obtained over time intervals with a predefined time interval width, for example, 5 milliseconds, 10 milliseconds, 20 milliseconds or 100 milliseconds (without limiting the present disclosure to these values). In some embodiments, a lower limit of the time interval width is given by a response time of an analog-to-digital converter for adapting to an updated sampling rate. The time intervals may be consecutive or may overlap. The time intervals may be a sliding window filter for determining the energy level. The sample control signal may indicate a sampling rate corresponding to the current time interval or to the next time interval, for example.

The energy level of the analog signal may be obtained for at least one predefined frequency band. For example, the energy level of the analog signal may be obtained for the highest predefined frequency band. If the energy level of the analog signal in the highest predefined frequency band does not exceed an energy threshold, the energy level of the analog signal in the next lower frequency band may be obtained. In some embodiments, if the energy level of the analog signal in a predefined frequency band exceeds the energy threshold, a sampling rate for sampling the analog signal is chosen not below the Nyquist rate corresponding to the predefined frequency band, and the energy levels of the analog signal in lower predefined frequency bands are not obtained in some embodiments.

In some embodiments, the energy level of the analog signal in the predefined frequency bands is obtained in parallel.

In some embodiments, the energy level of the analog signal is obtained in predefined frequency bands but the lowest predefined frequency band, and if none of the obtained frequency levels exceeds the energy threshold, a sampling rate not below the Nyquist rate corresponding to the lowest predefined frequency band is chosen.

In some embodiments, the energy level of the analog signal is obtained also in the lowest predefined frequency band, and if the energy level of the analog signal does not exceed the energy threshold in any one of the predefined frequency bands, the sample control signal may indicate no sampling rate (or a sampling rate of 0.0 kHz), and sampling of the analog signal may be paused until the energy level of the analog signal in at least one predefined frequency band exceeds the energy threshold.

The predefined frequency bands may be equally or logarithmically (or in other form) distributed over a frequency range that is expected to be present in the analog signal or that can be sampled with a given analog-to-digital converter. There may be two, five, ten or hundred predefined frequency bands, for example (without limiting the present disclosure in that regard). In some embodiments, the number of predefined frequency bands may be limited by a power consumption of obtaining the energy levels of the analog signal in the predefined frequency bands or by a size of the circuit.

In some embodiments that pertain to sampling human-audible sound, there are predefined frequency bands with corresponding Nyquist rates of 8 kHz, 22.05 kHz, 32 kHz and 44.1 kHz, for example (without limiting the present disclosure in that regard).

The predefined frequency bands may correspond to different frequency spectra that are expected in the analog signal. For example, if the analog signal is expected to contain audio information of music, there may be predefined frequency bands corresponding to typical frequency spectra of singing, contrabass, violin and flute (or any other instrument).

The energy level may be obtained per predefined frequency band and per time interval of the analog signal.

In some embodiments, the energy level of the analog signal corresponds to the energy E of the analog signal s(t).

For example, the energy E of the analog signal s(t) in a time interval $[t_0, t_0+\Delta t]$ may be the area under the squared magnitude of the signal within the time interval:

$$E = \int_{t_0}^{t_0+\Delta t} |s(t)|^2 dt$$

In this case, the energy E of the analog signal may be obtained for one or more frequency bands separately.

Or, the energy E of the analog signal s in a frequency band $[f_0, f_0+\Delta f]$ may be the area under the squared magnitude of the Fourier transform $(\mathcal{F} s)(f)$ of the signal within a time interval:

$$E = \int_{f_0}^{f_0+\Delta f} |(\mathcal{F}s)(f)|^2 df$$

In this case, the Fourier transform of the analog signal and the energy E of the analog signal may be obtained for each time interval separately.

In some embodiments, the energy level corresponds to the relative energy in a predefined frequency band as a percentage of the energy of the signal integrated over all frequency bands.

In some embodiments, the energy level is based on a total harmonic distortion (THD) or on a signal-to-noise ratio (SNR) of the analog signal.

The sampling rate for sampling the analog signal may be controlled by indicating, in the generated sample control signal, a sampling rate to be used, a minimum sampling rate that must not be underrun or a minimum frequency or frequency band that must be sampled correctly.

The sampling rate for sampling the analog signal may be controlled by providing the generated sample control signal to one or more analog-to-digital converters.

In some embodiments, the generating of the sample control signal includes to generate the sample control signal based on an event, the event being generated based on a change of the energy level of the analog signal in the at least one predefined frequency band.

The event may be generated using an event-based audio sensor, e.g., a neuromorphic event-based audio sensor, which is also called silicon cochlea. The silicon cochlea may operate at low electrical power consumption and may be based on a traveling wave mechanism and/or on a bank of band-pass filters, for example.

The event-based audio sensor may detect an event based on a change of the energy level of the analog signal in at least one predefined frequency band. The event may be based on the energy level of the analog signal in the at least one predefined frequency band crossing an energy threshold from below to above or from above to below the energy threshold.

The sample control signal may be generated or updated in response to the event and may indicate a sampling rate corresponding to a highest predefined frequency band in which the energy level of the analog signal exceeds an energy threshold after the event.

For example, the event may be generated when the energy level of the analog signal in a highest predefined frequency band in which the energy level of the analog signal has previously been exceeding an energy threshold drops below the energy threshold. In such a case, the generated sample control signal may indicate a sampling rate lower than the previously indicated sampling rate.

For example, the event may be generated when the energy level of the analog signal increases from below to above an energy threshold in a predefined frequency band higher than a highest predefined frequency band in which the energy level of the analog signal has previously been exceeding the energy threshold. In such a case, the sample control signal may indicate a sampling rate higher than the previously indicated sampling rate.

In some embodiments, the generating of the sample control signal includes filtering the analog signal with a plurality of predefined frequency bands, and generating the sample control signal depending on a highest frequency band of the plurality of predefined frequency bands in which the energy level of the analog signal exceeds an energy threshold.

For example, the analog signal may be filtered with a filter bank of parallel high-pass or band-pass filters, each corresponding to a different predefined frequency band. The parallel high-pass or band-pass filters may be included in a low-power sensor. A filter bank may include at least two different filters configured to filter different (or overlapping) frequency bands.

Starting with a high-pass or band-pass filter corresponding to the highest predefined frequency band, the energy level of the filtered analog signal output by the high-pass or band-pass filter may be obtained. If the energy level exceeds an energy threshold, a sample control signal indicating a sampling rate not lower than the Nyquist rate corresponding to the highest predefined frequency band may be generated. If the energy level does not exceed the energy threshold, the energy level of the filtered analog signal output by the high-pass or band-pass filter corresponding to the next lower predefined frequency band may be obtained, and so on.

In some embodiments, the analog signal and the sample control signal are synchronized to compensate for a delay between the analog signal and the sample control signal.

Since, in some embodiments, obtaining an energy level of the analog signal, selecting a corresponding sampling signal for sampling the analog signal and generating the sample control signal takes some time, in some embodiments, the sample control signal corresponding to a portion of the analog signal is generated with a delay after the portion of the analog signal. Therefore, a sample rate for sampling the portion of the analog signal may be controlled only after the portion of the analog signal has been sampled.

Synchronizing the analog signal and the sample control signal may compensate for the delay between the analog signal and the sample control signal so that a sampling rate for sampling a portion of the analog signal can be controlled before sampling the portion of the analog signal based on the sample control signal corresponding to the portion of the analog signal.

In some embodiments, the synchronizing includes to delay the analog signal. For example, the analog signal may be delayed using an analog delay line so that a portion of the analog signal reaches an analog-to-digital converter not before the sample control signal corresponding to the portion of the analog signal reaches the analog-to-digital converter. Generally, an analog delay line is known to the skilled person, and may include, for example, a line having a predefined length, a couple of delay members (e.g. coupled capacitor and resistor), or the like. With delaying the analog signal, a delayed signal may be generated which corresponds to the analog signal with a delay.

In some embodiments, the synchronizing includes to generate the sample control signal based on predicting the energy level of the analog signal in the at least one predefined frequency band.

The energy level of the analog signal may be predicted using a predictive algorithm. For example, techniques used in speech coding and known to the skilled person such as Linear Predictive Coding (LPC) may be used to predict the energy level of the analog signal. The energy level of the analog signal may also be predicted using machine learning techniques based on artificial neural networks.

The predicting may be based on the analog signal and/or on an energy level of the analog signal in at least one predefined frequency band.

The energy level of the analog signal may be predicted for at least a subsequent time interval.

Thus, a sampling rate for sampling a portion of the analog signal may be controlled before the portion of the analog signal is sampled. For example, the sample control signal corresponding to the portion of the analog signal may reach an analog-to-digital converter before the portion of the analog signal reaches the analog-to-digital converter.

In some embodiments, low-pass filtering of the analog signal is controlled based on the sampling rate.

For example, low-pass filtering of the analog signal may be performed before analog-to-digital conversion of the analog signal to avoid aliasing due to components of the analog signal in a frequency band above the Nyquist frequency in which an energy level of the analog signal does not exceed an energy threshold, but in which a component of the analog signal is still measurable.

The low-pass filtering may be performed using a low-pass filter provided before an analog-to-digital converter. The cut-off frequency of the low-pass filter may be controlled based on the sample control signal to be the Nyquist frequency, i.e. half the sampling rate indicated by the sample control signal. With the low-pass filtering, a filtered signal may be generated which corresponds to the analog signal with frequencies above the cut-off frequency removed. However, in some embodiments, the low-pass filtering of the analog signal is not performed when subsampling an analog signal, e.g. when subsampling a band limited analog signal limited within a frequency band that exceeds the sampling rate at least partially.

In some embodiments, the controlling of the sampling rate includes to control an analog-to-digital converter with an adjustable sampling rate. For example, the sampling rate of the analog-to-digital converter may be adjusted based on the sample control signal.

In some embodiments, the controlling of the sampling rate includes to select, based on the sampling rate, an analog-to-digital converter from a plurality of analog-to-digital converters that correspond to different sampling rates. For example, a plurality of analog-to-digital converters may be provided for sampling the analog signal, wherein each analog-to-digital converter is configured to perform sampling at another sampling rate, and an analog-to-digital converter of the plurality of analog-to-digital converters may be selected based on the sample control signal.

In some embodiments, an energy threshold is adjustable. The energy threshold for generating the sample control signal based on the energy level of the analog signal in a predefined frequency band may be adjustable. The energy threshold may be adjustable manually or automatically, e.g. based on a percentile of the energy levels of the analog signals in a plurality of predefined frequency bands.

In some embodiments, a plurality of energy thresholds is provided. For example, a first energy threshold may be provided for a first predefined frequency band or group of predefined frequency bands, and a second energy threshold may be provided for a second predefined frequency band or group of predefined frequency bands. The energy thresholds may be adjusted manually or may be calculated automatically. For example, if the analog signal carries audio information, energy thresholds for a plurality of predefined frequency bands may be based on an equal-loudness contour of the human ear.

In some embodiments, the controlling includes to control the sampling rate to be at least the Nyquist rate corresponding to the at least one predefined frequency band in which the energy level of the analog signal exceeds an energy threshold. Thus, the significant frequency components of the analog signal may be sampled correctly.

In some embodiments, a system for processing analog signals includes a first circuit with a configuration as described above which is configured to process a first analog signal, and a second circuit with a configuration as described above which is configured to process a second analog signal.

In some embodiments, the first analog signal corresponds to sound from a first direction, and the second analog signal corresponds to sound from a second direction. For example, the first analog signal and the second analog signal may be generated by a first direct microphone and a second direct microphone, respectively. Thus, sound from different directions may be acquired with low electrical power consumption.

In some embodiments, a method for processing an analog signal includes generating a sample control signal depending on an energy level of the analog signal in at least one predefined frequency band, and controlling a sampling rate for sampling the analog signal based on the generated sample control signal.

The method may be configured as described above for the circuitry and each feature which can be configured by the circuitry can be a feature of the method.

In some embodiments, a computer program product includes instructions which, when executed by a computer, cause the computer to carry out the method as described above.

In some embodiments, a non-transitory computer-readable recording medium has stored thereon the computer program product as described above.

Returning to FIG. 1, there is illustrated, in a block diagram, an embodiment of a circuit 1 for processing an analog signal 2.

The circuit 1 includes a sample control unit 3 and a sampling unit 4.

The analog signal 2 is an analog audio signal and is generated by a microphone 5. In the circuit 1, the analog audio signal 2 is provided to the sample control unit 3 and to the sampling unit 4.

The sample control unit 3 has a silicon cochlea 6, an energy level comparison unit 7 and a sampling rate selection unit 8.

The sample control unit 3 receives the analog audio signal 2 and provides the analog audio signal 2 to the silicon cochlea 6.

The silicon cochlea 6 is a low-power neuromorphic event-based audio sensor and receives the analog audio signal 2. The silicon cochlea 6 is configured to generate an event 9 when an energy level of the analog audio signal 2 in a predefined frequency band changes. The silicon cochlea 6 outputs the event 9 and provides the event 9 to the energy level comparison unit 7.

The energy level comparison unit 7 receives the event 9 from the silicon cochlea 6 and compares, based on the event 9, an energy level of the analog audio signal 2, in a frequency band of a plurality of predefined frequency bands, with an energy threshold to obtain a highest frequency band of the plurality of predefined frequency bands in which the energy level of the analog audio signal 2 exceeds the energy threshold.

The energy level comparison unit 7 compares the energy level of the analog audio signal 2 in a frequency band of the plurality of predefined frequency bands indicated by the event 9 with the energy threshold if:

- the event 9 indicates a decreased energy level in a highest frequency band of the plurality of predefined frequency bands in which the energy level of the analog audio signal 2 has previously been exceeding the energy threshold, or
- if the event 9 indicates an increased energy level in a frequency band of the plurality of predefined frequency bands higher than the highest frequency band of the plurality of predefined frequency bands in which the energy level of the analog audio signal 2 has previously been exceeding the energy threshold.

The energy level comparison unit 7 generates a highest frequency band signal 10 that indicates the highest frequency band of the plurality of predefined frequency bands in which the energy level of the analog audio signal 2 exceeds the energy threshold.

The energy level comparison unit 7 generates the highest frequency band signal 10 upon receiving the event 9. In a time period, in which the energy level comparison unit 7 does not receive an event 9, it does not generate the highest frequency band signal 10.

The energy level comparison unit 7 outputs the highest frequency band signal 10 and provides the highest frequency band signal 10 to the sampling rate selection unit 8.

The sampling rate selection unit 8 receives the highest frequency band signal 10 from the energy level comparison unit 7 and selects, as a sampling rate for sampling the analog audio signal 2, the Nyquist rate corresponding to the highest predefined frequency band indicated by the highest frequency band signal 10, i.e. twice the highest frequency of the highest frequency band indicated by the highest frequency band signal 10.

The sampling rate selection unit 8 generates a sample control signal 11 that indicates the selected sampling rate for sampling the analog audio signal 2.

The sampling rate selection unit 8 generates the sample control signal 11 upon receiving the highest frequency band signal 10. In a time period, in which the sampling rate selection unit 8 does not receive a highest frequency band signal 10, it does not generate the sample control signal 11.

The sampling rate selection unit 8 outputs the sample control signal 11 and provides the sample control signal 11 to the sampling unit 4.

The sampling unit 4 includes a low-pass filter 12 and an analog-to-digital converter (ADC) 13.

The sampling unit 4 receives the analog audio signal 2 and provides the analog audio signal 2 to the low-pass filter 12.

The sampling unit 4 also receives the sample control signal 11 and provides the sample control signal 11 to the low-pass filter 12 and to the ADC 13.

The low-pass filter 12 receives the analog audio signal 2 and the sample control signal 11.

The low-pass filter 12 controls a cut-off frequency of the low-pass filter 12 to be the Nyquist frequency corresponding to the sampling rate indicated by the sample control signal 11, i.e. the low-pass filter 12 controls its cut-off frequency to be half the sampling rate indicated by the sample control signal 11.

When the low-pass filter 12 receives the sample control signal 11, it updates its cut-off frequency according to the sampling rate indicated by the sample control signal 11.

The low-pass filter 12 filters the analog audio signal 2 by removing frequencies that are higher than its cut-off frequency from the analog audio signal 2. The low-pass filter 12 outputs the analog audio signal 2 from which frequencies that are higher than the cut-off frequency have been removed as filtered analog audio signal 14 and provides the filtered analog audio signal 14 to the ADC 13. The filtered analog audio signal 14 corresponds to the analog audio signal 2 with frequencies above the cut-off frequency of the low-pass filter 12 removed.

The ADC 13 receives the filtered analog audio signal 14 and the sample control signal 11. The ADC 13 has an adaptable sampling rate and controls an internal sampling rate used for sampling the filtered analog audio signal 14 to be the sampling rate indicated by the sample control signal 11.

When the ADC 13 receives the sample control signal 11, it updates the internal sampling rate according to the sampling rate indicated by the sample control signal 11.

The ADC 13 samples the filtered analog audio signal 14 with the internal sampling rate and generates a digital signal 15 which includes a time series corresponding to the time course of the analog audio signal 2. The digital signal 15 also includes an indication of the internal sampling rate used for sampling the filtered analog audio signal 14.

Figure 2:
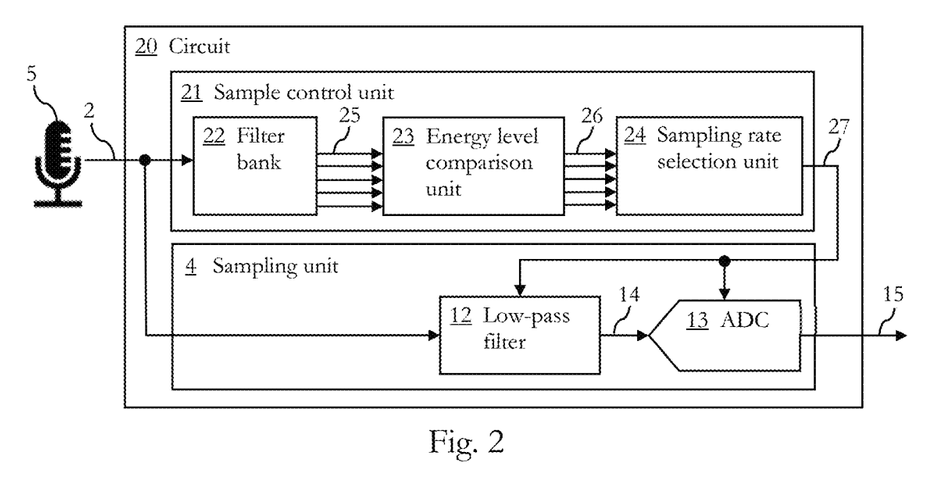
FIG. 2 illustrates, in a block diagram, an embodiment of a circuit for processing an analog signal using a filter bank.

FIG. 2 illustrates, in a block diagram, an embodiment of a circuit 20 for processing the analog audio signal 2.

Contrary to the circuit 1 of FIG. 1, the circuit 20 does not process the analog audio signal 2 using the silicon cochlea 6 but using a filter bank 22 that includes a plurality of filters.

The circuit 20 includes a sample control unit 21 and the sampling unit 4.

The circuit 20 receives the analog audio signal 2 generated by the microphone 5 and provides the analog audio signal 2 to the sample control unit 21 and to the sampling unit 4.

The sample control unit 21 includes a filter bank 22, an energy level comparison unit 23 and a sample rate selection unit 24.

The sample control unit 21 receives the analog audio signal 2 and provides it to the filter bank 22.

The filter bank 22 includes a plurality of high-pass filters. Each high-pass filter of the plurality of high-pass filters has a cut-off frequency different from the cut-off frequencies of the other high-pass filters of the plurality of high-pass filters. The different cut-off frequencies correspond to predefined frequency bands.

The filter bank 22 receives the analog audio signal 2 and provides the analog audio signal 2 in parallel to each high-pass filter of the plurality of high-pass filters. The plurality of high-pass filters generate high-pass filtered signals 25 by removing from the analog audio signal 2 all frequencies that are equal to or higher than the respective cut-off frequencies and output the high-pass filtered signals 25.

The high-pass filters of the filter bank 22 continuously generate and output the high-pass filtered signals 25.

The filter bank 22 outputs the high-pass filtered signals 25 and provides them to the energy level comparison unit 23.

The energy level comparison unit 23 receives the high-pass filtered signals 25, obtains an energy level of each of the high-pass filtered signals 25, obtains a difference between the energy levels of high-pass filtered signals 25 corresponding to pairwise subsequent cut-off frequencies as an energy level of the analog audio signal 2 in a corresponding predefined frequency band and compares the energy levels of the analog audio signal 2 in the predefined frequency bands with an energy threshold. As an exception, the energy level comparison unit 23 obtains the energy level of the analog audio signal 2 in the highest predefined frequency band directly as the energy level of the high-pass filtered signal 25 corresponding to the highest cut-off frequency.

The energy level comparison unit 23 generates a comparison signal 26 indicating the comparison result of each of the energy levels of the analog audio signal 2 in the predefined frequency bands.

The energy level comparison unit 23 continuously generates the comparison signal 26, outputs the comparison signal 26, and provides it to the sampling rate selection unit 24.

The sampling rate selection unit 24 receives the comparison signal 26 from the energy level comparison unit 23 and obtains, based on the comparison signal 26, a highest frequency band of the plurality of predefined frequency bands in which the energy level of the analog audio signal 2 exceeds the energy threshold.

The sampling rate selection unit 24 checks, starting from the highest predefined frequency band, whether the corresponding energy level of the analog audio signal 2 exceeds the threshold. If not, the sampling rate selection unit 24 proceeds with checking the energy level corresponding to the next lower predefined frequency band.

The sampling rate selection unit 24 selects, as a sampling rate for sampling the analog audio signal 2, the Nyquist rate corresponding to the highest frequency band of the plurality of predefined frequency bands in which the energy level of the analog audio signal 2 exceeds the energy threshold.

The sampling rate selection unit 24 generates a sample control signal 27 indicating the sampling rate for sampling the analog audio signal 2.

The sampling rate selection unit 24 generates the sample control signal 27 continuously and updates the sampling rate indicated by the sample control signal 27 upon selecting another sampling rate for sampling the analog audio signal 2.

The sampling rate selection unit 24 outputs the sample control signal 27 and provides it to the sampling unit 4.

The sampling unit 4 corresponds to the sampling unit 4 of the embodiment of FIG. 1. Therefore, the description of the sampling unit 4 is not repeated.

However, since the sample control signal 27 is continuously generated in the present embodiment, the low-pass filter 12 continuously receives the sample control signal 27 and updates its cut-off frequency when the sample control signal 27 indicates another sampling rate for sampling the analog audio signal 2.

Similarly, the ADC 13 continuously receives the sample control signal 27 and updates the internal sampling rate when the sample control signal 27 indicates another sampling rate for sampling the analog audio signal 2.

As a modification of the embodiment of FIG. 2, in some embodiments, the filter bank 22 includes a plurality of band-pass filters instead of the plurality of high-pass filters. The skilled person will understand the changes necessary for using band-pass filters instead of high-pass filters.

Figure 3:
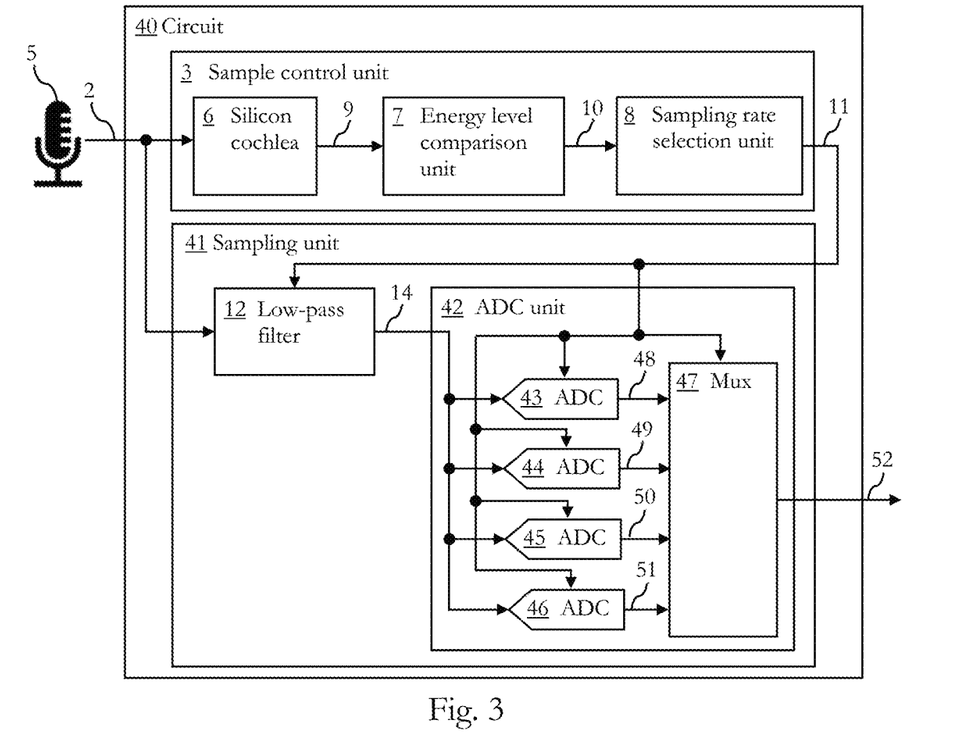
FIG. 3 illustrates, in a block diagram, an embodiment of a circuit for processing an analog signal using a plurality of analog-to-digital converters with predefined sampling rates.

FIG. 3 illustrates, in a block diagram, an embodiment of a circuit 40 for processing an analog audio signal 2.

Contrary to the circuit 1 of FIG. 1, the circuit 40 does not process the analog audio signal 2 using the ADC 13 with an adaptable internal sampling rate but using a plurality of ADCs 43 to 46 with predefined (fixed) sampling rates.

The circuit 40 includes the sample control unit 3 and a sampling unit 41.

The analog audio signal 2 is generated by the microphone 5.

The circuit 40 receives the analog audio signal 2 and provides the analog audio signal 2 to the sample control unit 3 and to the sampling unit 41.

The sample control unit 3 is configured as described above with reference to FIG. 1.

The sample control unit 3 outputs the sample control signal 11 and provides the sample control signal 11 to the sampling unit 41.

The sampling unit 41 includes the low-pass filter 12 and an analog-to-digital converter (ADC) unit 42.

The sampling unit 41 receives the analog audio signal 2 and provides the analog audio signal 2 to the low-pass filter 12.

Furthermore, the sampling unit 41 receives the sample control signal 11 and provides the sample control signal 11 to the low-pass filter 12 and to the ADC unit 42.

The low-pass filter 12 is configured as described above with reference to FIG. 1.

The low-pass filter 12 outputs the filtered analog audio signal 14 and provides the filtered analog audio signal 14 to the ADC unit 42.

The ADC unit 42 includes an ADC 43, an ADC 44, an ADC 45, an ADC 46 and a multiplexer (mux) 47.

The ADC unit 42 receives the filtered analog audio signal 14 from the low-pass filter 12 and provides it to the ADCs 43 to 46.

Furthermore, the ADC unit 42 receives the sample control signal 11 and provides it to the ADCs 43 to 46 and to the multiplexer 47.

The ADCs 43 to 46 receive the filtered analog audio signal 14 and sample the filtered analog audio signal 14 with a predefined (fixed) sampling rate. The ADC 43 samples the filtered analog audio signal 14 with a sampling rate of 44.1 kHz. The ADC 44 samples the filtered analog audio signal 14 with a sampling rate of 32 kHz. The ADC 45 samples the filtered analog audio signal 14 with a sampling rate of 22.05 kHz. The ADC 46 samples the filtered analog audio signal 14 with a sampling rate of 8 kHz.

The ADCs 43 to 46 generate sampled signals 48 to 51 that include digital signals corresponding to the time course of the filtered analog audio signal 14. The ADC 43 generates the sampled signal 48 that includes a digital signal corresponding to the time course of the filtered analog audio signal 14 sampled with a sampling rate of 44.1 kHz. The ADC 44 generates the sampled signal 49 that includes a digital signal corresponding to the time course of the filtered analog audio signal 14 sampled with a sampling rate of 32 kHz. The ADC 45 generates the sampled signal 50 that includes a digital signal corresponding to the time course of the filtered analog audio signal 14 sampled with a sampling rate of 22.05 kHz. The ADC 46 generates the sampled signal 51 that includes a digital signal corresponding to the time course of the filtered analog audio signal 14 sampled with a sampling rate of 8 kHz.

The ADCs 43 to 46 output the sampled signals 48 to 51 and provide them to the multiplexer 47.

Furthermore, the ADCs 43 to 46 receive the sample control signal 11 that indicates a sampling rate for sampling the analog audio signal 2.

Each of the ADCs 43 to 46 starts sampling the filtered analog audio signal 14 and generating the respective sampled signal 48 to 51 when the sample control signal 11 indicates the predefined sampling rate of the respective ADC 43 to 46 as the sampling rate for sampling the analog audio signal 2.

The ADCs 43 to 46 may be synchronized based on any known synchronization technique.

For example, when the sample control signal 11 indicates a sampling rate of 44.1 kHz for sampling the analog audio signal 2, the ADC 43, whose predefined sampling rate is 44.1 kHz, starts sampling the filtered analog audio signal 14 as well as generating and outputting the sampled signal 48, whereas the ADCs 44 to 46 stop (or do not start) sampling the filtered analog audio signal 14 and generating the sampled signals 49 to 51.

That means, at each point in time only one of the ADCs 43 to 46 samples the filtered analog audio signal 14, generates the respective one of the sampled signals 48 to 51 and outputs the respective one of the sampled signals 48 to 51, so that, at each point in time, only one of the sampled signals 48 to 51 is generated, output and provided to the multiplexer 47.

The multiplexer 47 receives the sampled signals 48 to 51 from the ADCs 43 to 46. The multiplexer 47 also receives the sample control signal 11.

The multiplexer 47 detects, based on the sample control signal 11, which one of the sampled signals 48 to 51 is currently generated, and generates a digital signal 52 that includes the digital signal corresponding to the time course of the filtered analog audio signal 14 that is included in the sampled signal 48 to 51 that is currently generated.

The multiplexer 47 also inserts into the digital signal 52 an indication of the sampling rate with which the digital signal corresponding to the time course of the filtered analog audio signal 14 has been sampled.

When the multiplexer 47 receives the sampled signal 48 from the ADC 43, the multiplexer inserts an indication of a sampling rate of 44.1 kHz into the digital signal 52. When the multiplexer 47 receives the sampled signal 49 from the ADC 44, the multiplexer inserts an indication of a sampling rate of 32 kHz into the digital signal 52. When the multiplexer 47 receives the sampled signal 50 from the ADC 45, the multiplexer inserts an indication of a sampling rate of 22.05 kHz into the digital signal 52. When the multiplexer 47 receives the sampled signal 51 from the ADC 46, the multiplexer inserts an indication of a sampling rate of 8 kHz into the digital signal 52.

The multiplexer 47 outputs the digital signal 52.

As a modification of the circuit 40 of FIG. 3, in some embodiments, the circuit 40 includes the sample control unit 21 of FIG. 2 instead of the sample control unit 3 of FIG. 1, and the ADCs 43 to 46 may be selected based on the continuously generated sample control signal 27 instead of the event-based sample control signal 11. The skilled person understands which changes to the configuration of FIG. 3 are necessary for this modification.

Figure 4:
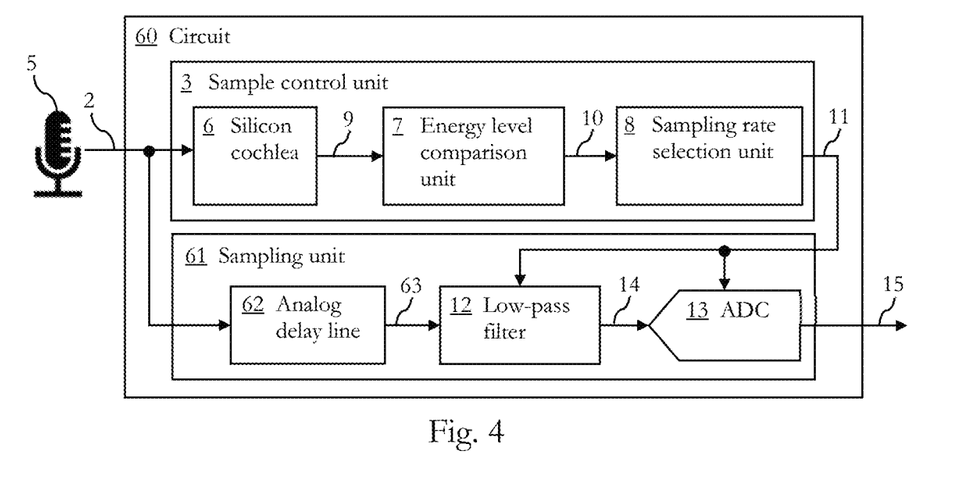
FIG. 4 illustrates, in a block diagram, an embodiment of a circuit for processing an analog signal including an analog delay line.

FIG. 4 illustrates, in a block diagram, an embodiment of a circuit 60 for processing the analog audio signal 2.

In addition to the circuit 1 of FIG. 1, the circuit 60 includes an analog delay line 62 for synchronizing the analog audio signal 2 and the sample control signal 11.

The circuit 60 includes the sample control unit 3 and a sampling unit 61.

The circuit 60 receives the analog audio signal 2, which is generated by the microphone 5, and provides the analog audio signal 2 to the sample control unit 3 and to the sampling unit 61.

The sample control unit 3 is configured as described above with reference to FIG. 1 and provides the sample control signal 11 to the sampling unit 61.

Generating the sample control signal 11 for a portion of the analog audio signal 2, for example for a time interval of the analog audio signal 2, can require some time. As a result, in the circuit 1 of FIG. 1, the sample control signal 11 indicating a sampling rate for sampling the portion of the analog audio signal 2 may reach the ADC 13 with a delay after the corresponding portion of the filtered analog audio signal 14 reaches the ADC 13.

Due to the delay between the portion of the analog audio signal 2 (or of the filtered analog audio signal 14) and the sample control signal 11 indicating the sampling rate for sampling the portion of the analog audio signal 2, the portion of the analog audio signal 2 may, at least partially, be sampled with an inappropriate sampling rate because the ADC 13 starts sampling the portion of the filtered analog audio signal 14 before the ADC 13 receives, via the sample control signal 11, the appropriate sampling rate for sampling the portion of the analog audio signal 2.

Therefore, in the circuit 60, the analog audio signal 2 is delayed before sampling to synchronize the analog audio signal 2 and the sample control signal 11. Thus, the circuit 60 compensates for the delay between the analog audio signal 2 and the sample control signal 11.

The sampling unit 61 includes an analog delay line 62 for synchronizing the analog audio signal 2.

The sampling unit 61 receives the analog audio signal 2 and provides it to the analog delay line 62.

Furthermore, the sampling unit 61 receives the sample control signal 11 and provides it to the low-pass filter 12 and to the ADC 13.

The analog delay line 62 receives the analog audio signal 2 and generates a delayed signal 63 in which the analog audio signal 2 is delayed. The amount by which the analog delay line 62 delays the delayed signal 63 with respect to the analog audio signal 2 corresponds to the delay between the analog audio signal 2 and the sample control signal 11 caused by the duration of generating the sample control signal 11 based on the analog audio signal 2.

Therefore, the delayed signal 63 is a signal corresponding to the analog audio signal 2 synchronized with the sample control signal 11.

The amount by which the delayed signal 62 is delayed with respect to the analog audio signal 2 is predefined and is based on characteristics of the sample control unit 3.

The analog delay line 62 outputs the delayed signal 63 and provides it to the low-pass filter 12.

The low-pass filter 12 receives the delayed signal 63 from the analog delay line 62 and the sample control signal 11 and generates the filtered analog audio signal 14, as described above with reference to FIG. 1.

As the low-pass filter 12 generates the filtered analog audio signal 14 based on the delayed signal 63, the low-pass filter 12 can adapt its cut-off frequency based on the sample control signal 11 in a manner synchronized with the analog audio signal 2.

The low-pass filter 12 outputs the filtered analog audio signal 14 and provides it to the ADC 13.

The ADC 13 is configured as described above with reference to FIG. 1.

The ADC 13 receives the filtered analog audio signal 14 from the low-pass filter 12 and the sample control signal 11.

As the filtered analog audio signal 14 is based on the delayed signal 63, it is synchronized with the sample control signal 11. As a result, the ADC 13 receives the sample control signal 11 indicating a sampling rate for sampling a portion of the analog audio signal 2 before it starts sampling the corresponding portion of the filtered analog audio signal 14. Thus, the ADC 13 can sample the portion of the filtered analog audio signal 14 with the appropriate sampling rate based on the sample control signal 11 indicating the sampling rate for sampling the portion of the analog audio signal 2.

The ADC 13 generates and outputs the digital signal 15, as described above with reference to FIG. 1.

As a modification of the circuit 60 of FIG. 4, in some embodiments, the sample control unit 21 of FIG. 2 is provided in the circuit 60 instead of the sample control unit 3. The skilled person understands which changes are necessary to the configuration of the circuit 60 of FIG. 4 for this modification.

As a further modification of the circuit 60 of FIG. 4, in some embodiments, the ADC unit 42 of FIG. 3 is provided in the circuit 60 instead of the ADC 13 of FIG. 1. The skilled person understands which changes are necessary to the configuration of the circuit 60 of FIG. 4 for this modification.

Figure 5:
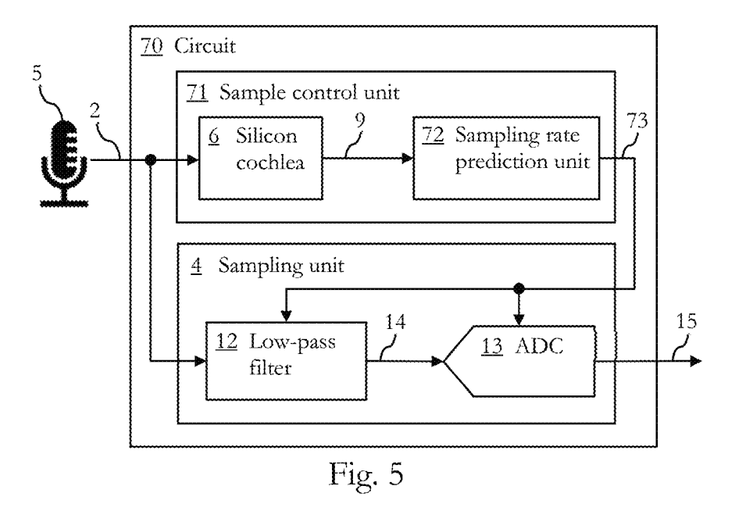
FIG. 5 illustrates, in a block diagram, an embodiment of a circuit for processing an analog signal including predicting a sampling rate.

FIG. 5 illustrates, in a block diagram, an embodiment of a circuit 70 for processing the analog audio signal 2.

The circuit 70 of FIG. 5 synchronizes the analog audio signal 2 and a sample control signal 73 by predicting a sampling rate for sampling the analog audio signal 2.

The circuit 70 includes a sample control unit 71 and the sampling unit 4.

The circuit 70 receives the analog audio signal 2, which is generated by the microphone 5, and provides the analog audio signal 2 to the sample control unit 71 and to the sampling unit 4.

The sample control unit 71 includes the silicon cochlea 6 and a sampling rate prediction unit 72.

The sample control unit 71 provides the analog audio signal 2 to the silicon cochlea 6.

The silicon cochlea 6 receives the analog audio signal 2, generates the event 9, as described above with reference to FIG. 1, and provides the event 9 to the sampling rate prediction unit 72.

The sampling rate prediction unit 72 receives the event 9 from the silicon cochlea 6 and predicts, based on the event 9, a sampling rate for sampling a future portion of the analog audio signal 2. The future portion of the analog audio signal 2 is a portion of the analog audio signal 2 that comes after a portion of the analog audio signal 2 on which the event 9 is based.

The future portion of the analog audio signal 2 comes after the portion of the analog audio signal 2 on which the event 9 is based by at least an amount necessary to compensate for the delay between the analog audio signal 2 and the sample control signal 73.

The sampling rate prediction unit 72 predicts the sampling rate for sampling the future portion of the analog audio signal 2 using a predictive algorithm. Examples for the predictive algorithm include techniques of traditional speech coding, such as Linear Predictive Coding (LPC), and machine learning techniques based on artificial neural networks.

The sampling rate prediction unit 72 generates a sample control signal 73 that indicates the predicted sampling rate for sampling the future portion of the analog audio signal 2.

The sampling rate prediction unit 72 outputs the sample control signal 73 and provides it to the sampling unit 4.

The sampling unit 4 is configured as described above with reference to FIG. 1.

The sampling unit 4 receives the analog audio signal 2 and provides it to the low-pass filter 12.

Furthermore, the sampling unit 4 receives the sample control signal 73 and provides it to the low-pass filter 12 and to the ADC 13.

The low-pass filter 12 receives the analog audio signal 2 and the sample control signal 73 and generates the filtered analog audio signal 14, as described above with reference to FIG. 1.

As the sample control signal 73 indicates a sampling rate for sampling the future portion of the analog audio signal 2, the low-pass filter 12 can adapt its cut-off frequency according to the sampling rate for sampling the future portion of the analog audio signal 2 before filtering the future portion of the analog audio signal 2.

The low-pass filter 12 outputs the filtered analog audio signal 14 and provides it to the ADC 13.

The ADC 13 is configured as described above with reference to FIG. 1.

The ADC 13 receives the filtered analog audio signal 14 from the low-pass filter 12 and the sample control signal 73, and generates the digital signal 15, which includes a time series corresponding to the time course of the analog audio signal 2 and an indication of the internal sampling rate used for sampling the filtered analog audio signal 14.

As the sampling rate for sampling the future portion of the analog audio signal 2 indicated by the sample control signal 73 is predicted based on an earlier portion than the future portion of the analog audio signal 2, the ADC 13 can adapt its internal sampling rate to the sampling rate for sampling the future portion of the analog audio signal 2 indicated by the sample control signal 73 before starting to sample the future portion of the analog audio signal 2 (or a corresponding portion of the filtered analog audio signal 14).

Thus, the delay between the analog audio signal 2 and the sample control signal 73 is compensated for by predicting a sampling rate for sampling the future portion of the analog audio signal 2.

The ADC 13 outputs the digital signal 15.

As a modification of the circuit 70, in some embodiments, the filter bank 22 of FIG. 2 is provided instead of the silicon cochlea 6, so that the sample control signal 73 indicating a predicted sampling rate may be generated and output continuously instead of event-based.

As a further modification of the circuit 70, in some embodiments, the ADC unit 42 of FIG. 3 is provided instead of the ADC 13 of FIG. 1, and/or the analog delay line 62 of FIG. 4 may be provided before the low-pass filter 12.

The skilled person will understand which changes to the circuit 70 of FIG. 5 are necessary to carry out one, some, or all of these modifications.

Figure 6:
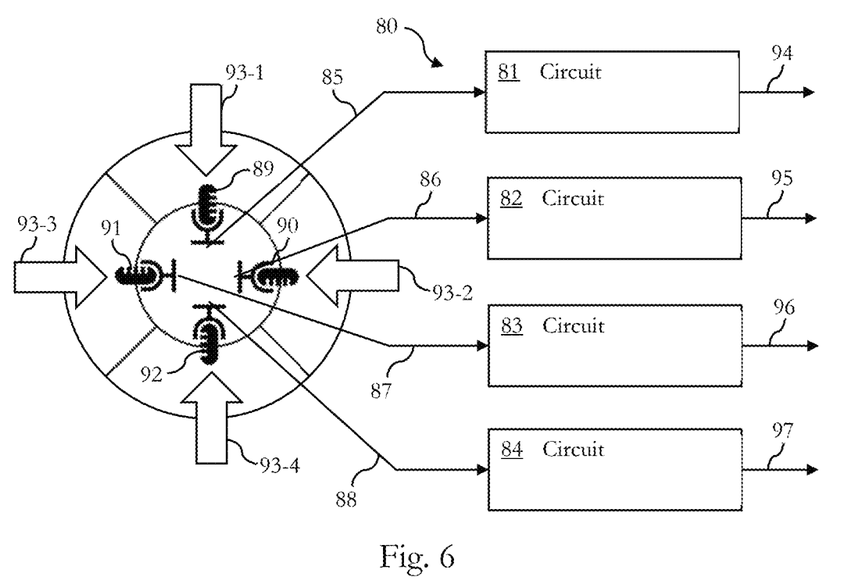
FIG. 6 illustrates, in a block diagram, an embodiment of a system for processing a plurality of analog audio signals.

FIG. 6 illustrates, in a block diagram, an embodiment of a system 80 for processing a plurality of analog audio signals.

The system 80 includes circuits 81 to 84 for processing analog audio signals 85 to 88, which are generated by direct microphones 89 to 92, each of which receives a sound wave in a limited angle from a different direction.

Each of the circuits 81 to 84 may be configured as the circuit 1 of FIG. 1, as the circuit 20 of FIG. 2, as the circuit 40 of FIG. 3, as the circuit 60 of FIG. 4 or as the circuit 70 of FIG. 5.

The circuit 81 receives the analog audio signal 85, which is generated by the direct microphone 89. The direct microphone 89 receives a sound wave from a first direction 93-1 and generates the analog audio signal 85 based on the sound wave from the first direction 93-1.

The circuit 82 receives the analog audio signal 86, which is generated by the direct microphone 90. The direct microphone 90 receives a sound wave from a second direction 93-2 and generates the analog audio signal 86 based on the sound wave from the second direction 93-2.

The circuit 83 receives the analog audio signal 87, which is generated by the direct microphone 91. The direct microphone 91 receives a sound wave from a third direction 93-3 and generates the analog audio signal 87 based on the sound wave from the third direction 93-3.

The circuit 84 receives the analog audio signal 88, which is generated by the direct microphone 92. The direct microphone 92 receives a sound wave from a fourth direction 93-4 and generates the analog audio signal 88 based on the sound wave from the fourth direction 93-4.

The circuits 81 to 84 process the analog audio signals 85 to 88 as described above. The circuits 81 to 84 sample the analog audio signals 85 to 88 with sampling rates depending on an energy level of the analog audio signals 85 to 88 in at least one predefined frequency band and generate digital signals 94 to 97.

The circuit 81 generates and outputs the digital signal 94 which includes a time series corresponding to the analog audio signal 85. The circuit 82 generates and outputs the digital signal 95 which includes a time series corresponding to the analog audio signal 86. The circuit 83 generates and outputs the digital signal 96 which includes a time series corresponding to the analog audio signal 87. The circuit 84 generates and outputs the digital signal 97 which includes a time series corresponding to the analog audio signal 88.

Thus, power can be saved when sampling the analog audio signals 85 to 88 from the direct microphones 89 to 92 because for each of the sound waves from the first to fourth direction 93-1 to 93-4 an optimal sampling rate can be used for sampling the corresponding analog audio signal 85 to 88.

In some embodiments with distributed sensor nodes such as the direct microphones 89 to 92, such power savings are critical.

Figure 7:
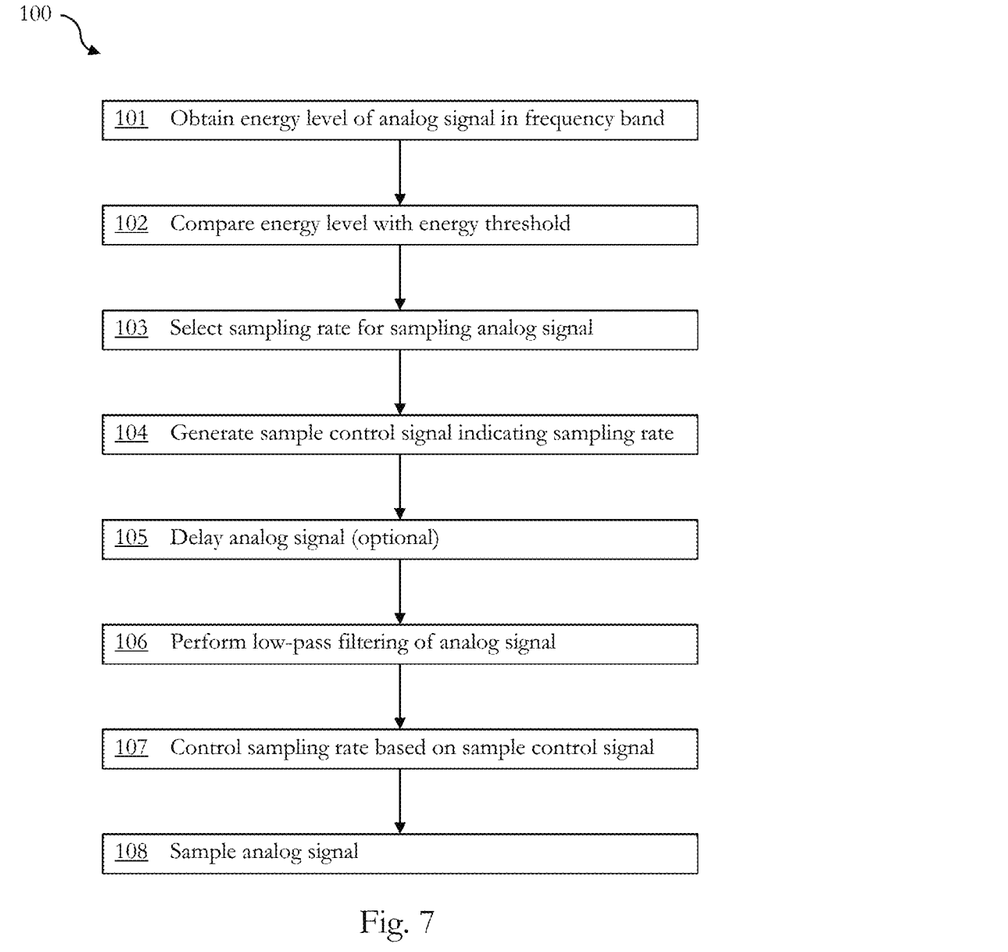
FIG. 7 illustrates, in a flow chart, an embodiment of a method for processing an analog signal.

FIG. 7 illustrates, in a flow chart, an embodiment of a method 100 for processing an analog signal.

The analog signal may be an analog audio signal.

At 101, an energy level of the analog signal in a predefined frequency band is obtained. The energy level of the analog signal in the predefined frequency band may be obtained based on an output of a silicon cochlea or of a filter bank, for example.

At 102, the energy level of the analog signal in the predefined frequency band is compared with an energy threshold to test whether the energy level of the analog signal in the predefined frequency band exceeds the energy threshold.

At 103, a sampling rate for sampling the analog signal is selected based on whether the energy level of the analog signal in the predefined frequency band exceeds the energy threshold. For example, if the energy level of the analog signal in the predefined frequency band exceeds the energy threshold, a higher sampling rate is selected that is equal to a Nyquist rate corresponding to a highest frequency in the predefined frequency band. If the energy level of the analog signal in the predefined frequency band does not exceed the energy threshold, a lower sampling rate is selected that is equal to a Nyquist rate corresponding to a lowest frequency in the predefined frequency band or that is equal to a Nyquist rate corresponding to a highest frequency in another predefined frequency band below the predefined frequency band. The sampling rate may also be predicted based on the analog signal or on the energy level of the analog signal in the predefined frequency band.

At 104, a sample control signal is generated that indicates the sampling rate for sampling the analog signal that has been selected at 103.

At 105, the analog signal is delayed to synchronize the analog signal and the sample control signal. Note that delaying the analog signal is optional and may not be performed in all embodiments.

At 106, low-pass filtering of the analog signal is performed. With the low-pass filtering, frequencies higher than a Nyquist frequency corresponding to the sampling rate indicated by the sample control signal, i.e. frequencies higher than half of the sampling rate indicated by the sample control signal, are removed from the analog signal to avoid aliasing.

At 107, a sampling rate of an analog-to-digital converter (ADC) is controlled to correspond to the sampling rate for sampling the analog signal indicated by the sample control signal.

At 108, the analog signal is sampled with the sampling rate indicated by the sample control signal. The sampling is performed using the ADC whose sampling rate has been controlled at 107 to correspond to the sampling rate indicated by the sample control signal. A digital signal may be generated that contains a time series corresponding to the sampled analog signal and an indication of the sampling rate with which the analog signal has been sampled.

The methods as described herein are also implemented in some embodiments as a computer program causing a computer and/or a processor to perform the method, when being carried out on the computer and/or processor. In some embodiments, also a non-transitory computer-readable recording medium is provided that stores therein a computer program product, which, when executed by a processor, such as the processor described above, causes the methods described herein to be performed.

All units and entities described in this specification and claimed in the appended claims can, if not stated otherwise, be implemented as integrated circuit logic, for example on a chip, and functionality provided by such units and entities can, if not stated otherwise, be implemented by software.

In so far as the embodiments of the disclosure described above are implemented, at least in part, using software-controlled data processing apparatus, it will be appreciated that a computer program providing such software control and a transmission, storage or other medium by which such a computer program is provided are envisaged as aspects of the present disclosure.

Note that the present technology can also be configured as described below.

(1) A circuitry for processing an analog signal, the circuitry being configured to:
generate a sample control signal depending on an energy level of the analog signal in at least one predefined frequency band, and
control a sampling rate for sampling the analog signal based on the generated sample control signal.

(2) The circuitry of (1), wherein the analog signal carries audio information.

(3) The circuitry of (1) or (2), wherein the generating includes to generate the sample control signal based on an event, the event being generated based on a change of the energy level of the analog signal in the at least one predefined frequency band.

(4) The circuitry of (1) or (2), wherein the generating of the sample control signal includes:
filtering the analog signal with a plurality of predefined frequency bands, and
generating the sample control signal depending on a highest frequency band of the plurality of predefined frequency bands in which the energy level of the analog signal exceeds an energy threshold.

(5) The circuitry of any one of (1) to (4), further being configured to synchronize the analog signal and the sample control signal to compensate for a delay between the analog signal and the sample control signal.

(6) The circuitry of (5), wherein the synchronizing includes to delay the analog signal.

(7) The circuitry of (5), wherein the synchronizing includes to generate the sample control signal based on predicting the energy level of the analog signal in the at least one predefined frequency band.

(8) The circuitry of any one of (1) to (7), further being configured to control low-pass filtering of the analog signal based on the sampling rate.

(9) The circuitry of any one of (1) to (8), wherein the controlling of the sampling rate includes to control an analog-to-digital converter with an adjustable sampling rate.

(10) The circuitry of any one of (1) to (8), wherein the controlling of the sampling rate includes to select, based on the sampling rate, an analog-to-digital converter from a plurality of analog-to-digital converters that correspond to different sampling rates.

(11) The circuitry of any one of (1) to (10), wherein an energy threshold is adjustable.

(12) The circuitry of any one of (1) to (11) wherein the controlling includes to control the sampling rate to be at least the Nyquist rate corresponding to the at least one predefined frequency band in which the energy level of the analog signal exceeds an energy threshold.

(13) A system for processing analog signals, the system comprising:
a first circuit according to any one of (1) to (12), the first circuit being configured to process a first analog signal, and
a second circuit according to any one of (1) to (12), the second circuit being configured to process a second analog signal.

(14) The system of (13), wherein
the first analog signal corresponds to sound from a first direction, and
the second analog signal corresponds to sound from a second direction.

(15) A method for processing an analog signal, the method comprising:
generating a sample control signal depending on an energy level of the analog signal in at least one predefined frequency band, and
controlling a sampling rate for sampling the analog signal based on the generated sample control signal.

(16) The method of (15), wherein the analog signal carries audio information.

(17) The method of (15) or (16), wherein the generating includes generating the sample control signal based on an event, the event being generated based on a change of the energy level of the analog signal in the at least one predefined frequency band.

(18) The method of (15) or (16), wherein the generating of the sample control signal includes:
filtering the analog signal with a plurality of predefined frequency bands, and
generating the sample control signal depending on a highest frequency band of the plurality of predefined frequency bands in which the energy level of the analog signal exceeds an energy threshold.

(19) The method of any one of (15) to (18), further comprising synchronizing the analog signal and the sample control signal to compensate for a delay between the analog signal and the sample control signal.

(20) The method of (19), wherein the synchronizing includes delaying the analog signal.

(21) The method of (19), wherein the synchronizing includes generating the sample control signal based on predicting the energy level of the analog signal in the at least one predefined frequency band.

(22) The method of any one of (15) to (21), further comprising controlling low-pass filtering of the analog signal based on the sampling rate.

(23) The method of any one of (15) to (22), wherein the controlling of the sampling rate includes controlling an analog-to-digital converter with an adjustable sampling rate.

(24) The method of any one of (15) to (22), wherein the controlling of the sampling rate includes selecting, based on the sampling rate, an analog-to-digital converter from a plurality of analog-to-digital converters that correspond to different sampling rates.

(25) The method of any one of (1) to (24), wherein an energy threshold is adjustable.

(26) The method of any one of (1) to (25), wherein the controlling includes controlling the sampling rate to be at least the Nyquist rate corresponding to the at least one predefined frequency band in which the energy level of the analog signal exceeds an energy threshold.

(27) A computer program product comprising instructions which, when executed by a computer, cause the computer to carry out the method of any one of (15) to (26).

(28) A non-transitory computer-readable recording medium having stored thereon the computer program product of (27).

The invention claimed is:

1. A circuitry for processing an analog signal, the circuitry being configured to:
generate a sample control signal depending on an energy level of the analog signal in at least one predefined frequency band,
control a sampling rate for sampling the analog signal based on the generated sample control signal, and
synchronize the analog signal and the sample control signal to compensate for a delay between the analog signal and the sample control signal.

2. The circuitry of claim 1, wherein the analog signal carries audio information.

3. The circuitry of claim 1, wherein the generating includes generating the sample control signal based on an event, the event being generated based on a change of the energy level of the analog signal in the at least one predefined frequency band.

4. The circuitry of claim 1, wherein the generating of the sample control signal includes:
filtering the analog signal with a plurality of predefined frequency bands, and
generating the sample control signal depending on a highest frequency band of the plurality of predefined frequency bands in which the energy level of the analog signal exceeds an energy threshold.

5. The circuitry of claim 1, wherein the synchronizing includes delaying the analog signal.

6. The circuitry of claim 1, wherein the synchronizing includes generating the sample control signal based on predicting the energy level of the analog signal in the at least one predefined frequency band.

7. The circuitry of claim 1, further being configured to control low-pass filtering of the analog signal based on the sampling rate.

8. The circuitry of claim 1, further being configured to control an analog-to-digital converter with an adjustable sampling rate based upon the sample control signal.

9. The circuitry of claim 1, further being configured to select, based on the sampling rate, an analog-to-digital converter from a plurality of analog-to-digital converters that correspond to different sampling rates.

10. A method for processing an analog signal, the method comprising:
generating a sample control signal depending on an energy level of the analog signal in at least one predefined frequency band,
controlling a sampling rate for sampling the analog signal based on the generated sample control signal, and
synchronizing the analog signal and the sample control signal to compensate for a delay between the analog signal and the sample control signal.

11. The method of claim 10, wherein the analog signal carries audio information.

12. The method of claim 10, wherein the generating includes generating the sample control signal based on an event, the event being generated based on a change of the energy level of the analog signal in the at least one predefined frequency band.

13. The method of claim 10, wherein the generating of the sample control signal includes:
   filtering the analog signal with a plurality of predefined frequency bands, and
   generating the sample control signal depending on a highest frequency band of the plurality of predefined frequency bands in which the energy level of the analog signal exceeds an energy threshold.

14. The method of claim 10, wherein the synchronizing includes delaying the analog signal.

15. The method of claim 10, wherein the synchronizing includes generating the sample control signal based on predicting the energy level of the analog signal in the at least one predefined frequency band.

16. The method of claim 10, further comprising controlling low-pass filtering of the analog signal based on the sampling rate.

17. The method of claim 10, further comprising controlling an analog-to-digital converter with an adjustable sampling rate based upon the sample control signal.

18. The method of claim 10, further comprising selecting, based on the sampling rate, an analog-to-digital converter from a plurality of analog-to-digital converters that correspond to different sampling rates.

\* \* \* \* \*